US009053850B2

(12) United States Patent
Johnson et al.

(10) Patent No.: US 9,053,850 B2
(45) Date of Patent: Jun. 9, 2015

(54) IMPLEMENTING ADJUSTABLE SIZE FERRITE CORE FOR EMI CABLE NOISE SUPPRESSION

(75) Inventors: David B. Johnson, Rochester, MN (US); Dennis J. Wurth, Rochester, MN (US)

(73) Assignee: International Business Machines Corporation, Armonk, NC (US)

( * ) Notice: Subject to any disclaimer, the term of this patent is extended or adjusted under 35 U.S.C. 154(b) by 578 days.

(21) Appl. No.: 13/219,884

(22) Filed: Aug. 29, 2011

(65) Prior Publication Data

US 2013/0048371 A1 Feb. 28, 2013

(51) Int. Cl.

*H01F 17/06* (2006.01)
*H01F 21/06* (2006.01)
*H01F 27/24* (2006.01)
*H05K 9/00* (2006.01)
*H01F 17/04* (2006.01)

(52) U.S. Cl.

CPC .......... *H01F 17/04* (2013.01); *H01F 2017/065* (2013.01)

(58) Field of Classification Search

USPC ................... 336/175, 131, 132, 212; 174/391
See application file for complete search history.

(56) References Cited

U.S. PATENT DOCUMENTS

| | | | | |
|---|---|---|---|---|
| 3,423,710 | A * | 1/1969 | Allen | 336/155 |
| 4,531,274 | A * | 7/1985 | Sanders | 29/267 |
| 4,825,185 | A | 4/1989 | Matsui | |
| 4,980,654 | A * | 12/1990 | Moulton | 333/12 |
| 5,003,278 | A | 3/1991 | May | |
| 5,287,074 | A * | 2/1994 | Meguro et al. | 333/12 |
| 5,334,955 | A | 8/1994 | Strnad | |
| 5,355,109 | A | 10/1994 | Yamazaki | |
| 5,539,369 | A * | 7/1996 | Selker et al. | 336/212 |
| 5,900,796 | A | 5/1999 | Parker | |
| 6,160,465 | A * | 12/2000 | Yamaguchi et al. | 336/110 |
| 6,262,361 | B1 | 7/2001 | Konz | |
| 6,346,673 | B1 | 2/2002 | Onizuka | |
| 6,512,425 | B2 | 1/2003 | Morita et al. | |
| 7,221,235 | B2 | 5/2007 | Gilliland | |
| 2005/0285708 | A1 * | 12/2005 | Berens et al. | 336/212 |

* cited by examiner

*Primary Examiner* — Elvin G Enad
*Assistant Examiner* — Ronald Hinson
(74) *Attorney, Agent, or Firm* — Joan Pennington

(57) ABSTRACT

A method and structures for implementing an adjustable size ferrite core for electromagnetic interference (EMI) cable noise suppression. A plurality of ferrite core segments are mated together defining an adjustable size cable receiving cavity. Each of the ferrite core segments includes an inner wall portion with mating fingers extending along adjoining edges. The mating fingers are selectively positioned together to select a size of the adjustable cable receiving cavity.

12 Claims, 12 Drawing Sheets

IMPLEMENTING ADJUSTABLE SIZE FERRITE CORE FOR EMI CABLE NOISE SUPPRESSION

FIELD OF THE INVENTION

The present invention relates generally to the data processing field, and more particularly, to a method, and structures for implementing an adjustable size ferrite core for electromagnetic interference (EMI) cable noise suppression.

DESCRIPTION OF THE RELATED ART

EMI noise suppression for cables often is provided using a ferrite core, such as a snap-on ferrite core. Currently, there is a limited number of available ferrite core sizes. For a ferrite core to be effective, the gap between the cable and the inner dimension of the core needs to be minimized, for example, providing virtually no air-gap. Due to the number of available core sizes the effectiveness of a ferrite core's placement on the cable is limited.

As used in the present specification and claims, the term ferrite core should be understood to broadly include cores made of various materials effective for electromagnetic interference (EMI) cable noise suppression, including a material having a magnetic permeability greater than one, ferrite materials having a selected ferrite composition, other ferromagnetic materials, and paramagnetic materials, individually or in combination.

As used in the present specification and claims, the term electromagnetic interference (EMI) noise suppression should be understood to broadly include, and to be used interchangeably with, electromagnetic compatibility (EMC) shielding, EMI shielding, radio frequency interference (RFI) shielding, RFI noise suppression, electrical conduction and/or grounding, corona shielding, and electro-static discharge (ESD) protection.

A need exists for an effective mechanism for implementing electromagnetic interference (EMI) cable noise suppression. It is desirable to provide an adjustable size ferrite core that has a generally simple configuration and that is generally inexpensive to produce.

SUMMARY OF THE INVENTION

Principal aspects of the present invention are to provide a method, and structures for implementing an adjustable size ferrite core for electromagnetic interference (EMI) cable noise suppression. Other important aspects of the present invention are to provide such method and structures substantially without negative effects and to overcome many of the disadvantages of prior art arrangements.

In brief, a method and structures for implementing an adjustable size ferrite core for electromagnetic interference (EMI) cable noise suppression. A plurality of ferrite core segments are mated together defining an adjustable size cable receiving cavity. Each of the ferrite core segments includes an inner wall portion with mating fingers extending along adjoining edges. The mating fingers of adjacent ferrite core segments are selectively positioned together to provide a size of the adjustable cable receiving cavity.

In accordance with features of the invention, each ferrite core segment is formed of a material having a magnetic permeability greater than one. The adjustable cable receiving cavity includes a circular shape. The adjustable cable receiving cavity includes an oblong shape, for example, used with flat cable, such as flat ribbon cable.

In accordance with features of the invention, the mating fingers of adjacent ferrite core segments are arranged for sliding contact engagement. The ferrite core segments are mated together, for example, around a cable and held together with a retaining cover, such as, multiple plastic retaining members or other plastic housing.

In accordance with features of the invention, the ferrite core segments are tightly mated together around the cable, maintaining effective electromagnetic interference (EMI) cable noise suppression.

In accordance with features of the invention, the plurality of ferrite core segments includes an elongated inner wall portion and a plurality of offset and spaced apart mating fingers on opposed edges of the elongated inner wall portion between opposed ends of the elongated inner wall portion. The plurality of ferrite core segments with the elongated inner wall portion includes an overall L shape.

In accordance with features of the invention, the plurality of ferrite core segments includes a plurality of U shaped segments.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structures are provided for implementing an adjustable size ferrite core for electromagnetic interference (EMI) cable noise suppression.

Figure 1A:
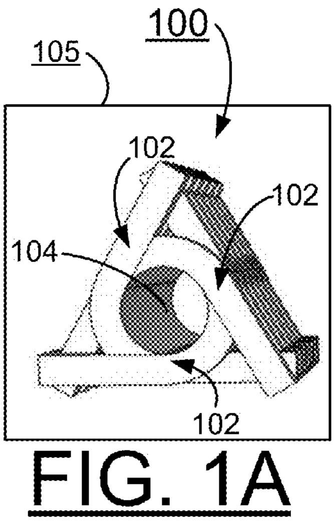
FIGS. 1A, 1B, and 1C are perspective views not to scale of an example structure for implementing an adjustable size ferrite core for electromagnetic interference (EMI) noise suppression in accordance with a preferred embodiment.
Figure 1B:
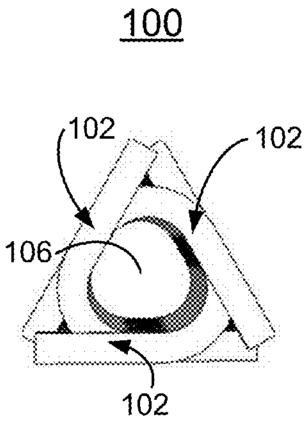
Figure 1C:
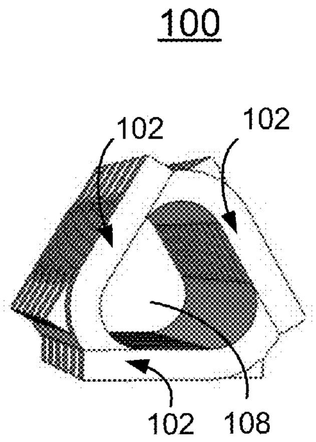

Having reference now to the drawings, in FIGS. 1A, 1B, and 1C there is shown not to scale an example structure for implementing an adjustable size ferrite core for electromagnetic interference (EMI) noise suppression generally designated by the reference character 100 in accordance with a preferred embodiment.

Referring to FIG. 1A, the adjustable size ferrite core structure 100 includes a plurality of ferrite core segments 102 that are mated together defining an adjustable size cable receiving cavity 104. In FIG. 1A, the ferrite core segments 102 are positioned in a fully closed position. In FIG. 1A, the ferrite core segments 102 fit together concentrically around a center of the cable receiving cavity 104.

In accordance with features of the invention, the ferrite core segments 102 are mated together, for example, around an associated cable (not shown) and are held together with a retaining cover 105, such as multiple plastic retaining members or other housing. The retaining cover 105 is an adjustable retaining cover configured to implement a force on each of the ferrite core segments 102 with the plurality of ferrite core segments 102 mated together defining a particular adjustable size cable receiving cavity.

Referring to FIG. 1B, the adjustable size ferrite core structure 100 includes the plurality of ferrite core segments 102 that are mated together defining another adjustable size cable receiving cavity 106, for a larger diameter cable.

Referring to FIG. 1C, the adjustable size ferrite core structure 100 includes the plurality of ferrite core segments 102 that are mated together defining an adjustable size cable receiving cavity 108, for another larger diameter cable.

Figure 2:
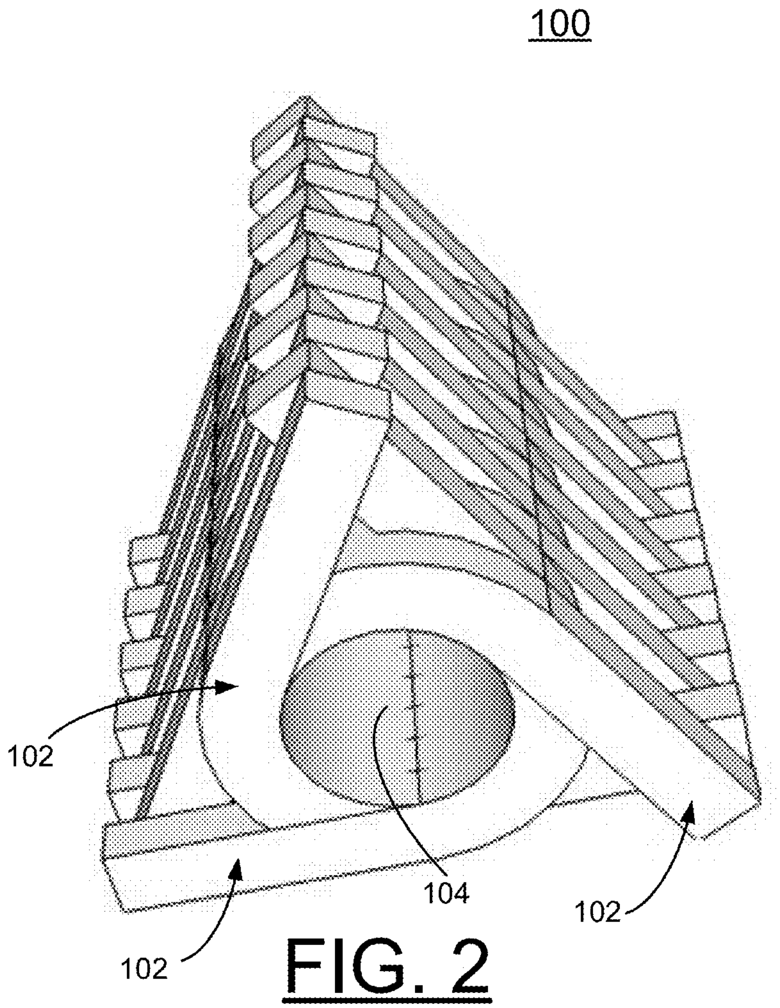
FIGS. 2, 3, and 4 are perspective views not to scale further illustrating the example structure 100 of FIG. 1A for implementing an adjustable size ferrite core for electromagnetic interference (EMI) noise suppression in accordance with a preferred embodiment.
Figure 3:
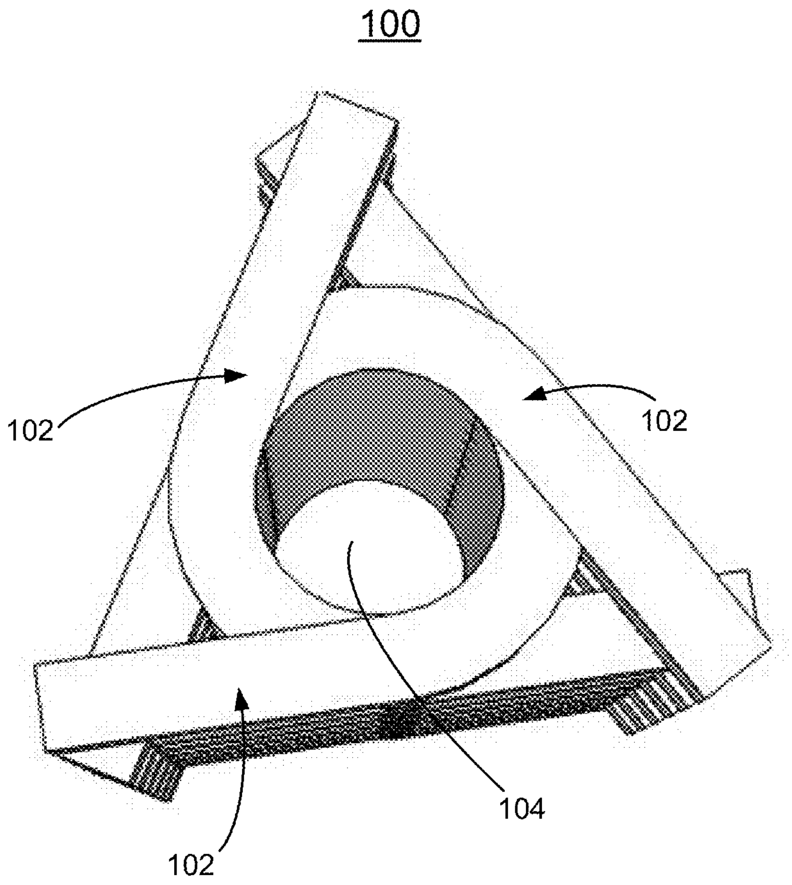
Figure 4:
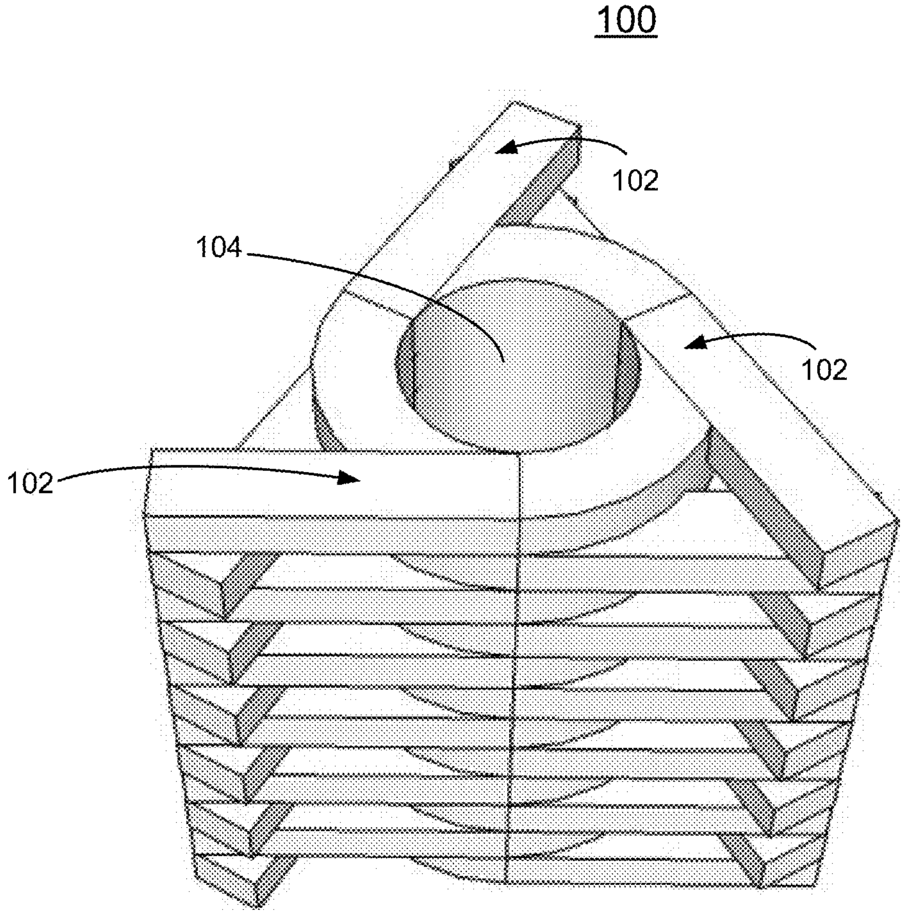

Referring to FIGS. 2, 3, and 4, the ferrite core structure 100 of FIG. 1A implementing the adjustable size cable receiving cavity 104 for electromagnetic interference (EMI) noise suppression is further illustrated in various views.

Each ferrite core segment 102 is formed of a material having a magnetic permeability greater than one. The adjustable cable receiving cavity includes a circular shape in the illustrated position of the ferrite core segments 102 shown in FIGS. 1A, 2, 3, and 4.

Figure 5:
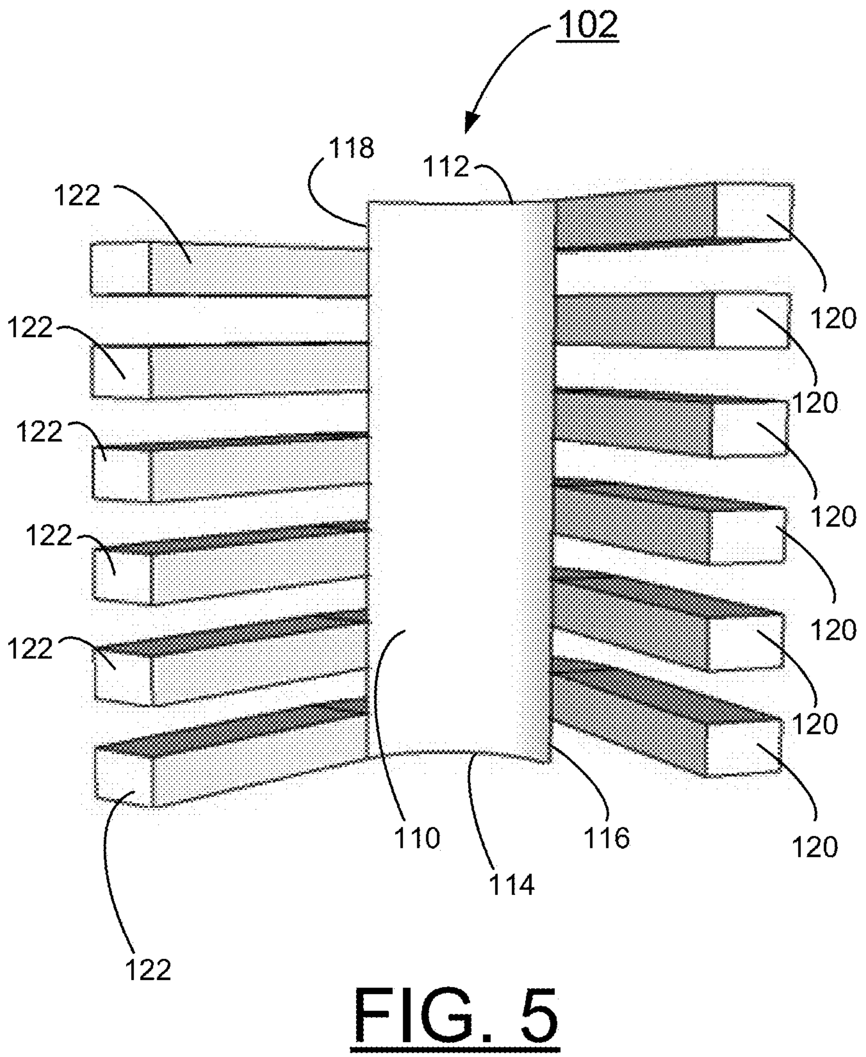
FIGS. 5, 6, and 7 are perspective views not to scale further illustrating the ferrite core segment of the example structure of FIGS. 1A, 1B, and 1C for implementing an adjustable size ferrite core for electromagnetic interference (EMI) noise suppression in accordance with a preferred embodiment.
Figure 6:
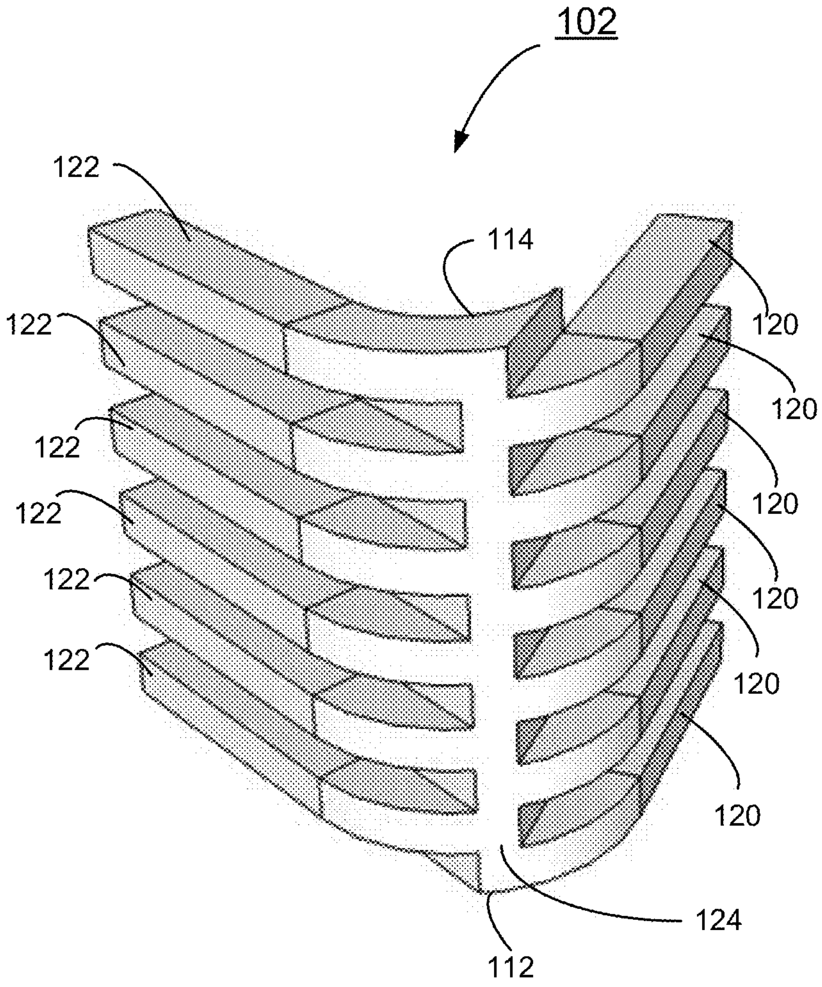
Figure 7:
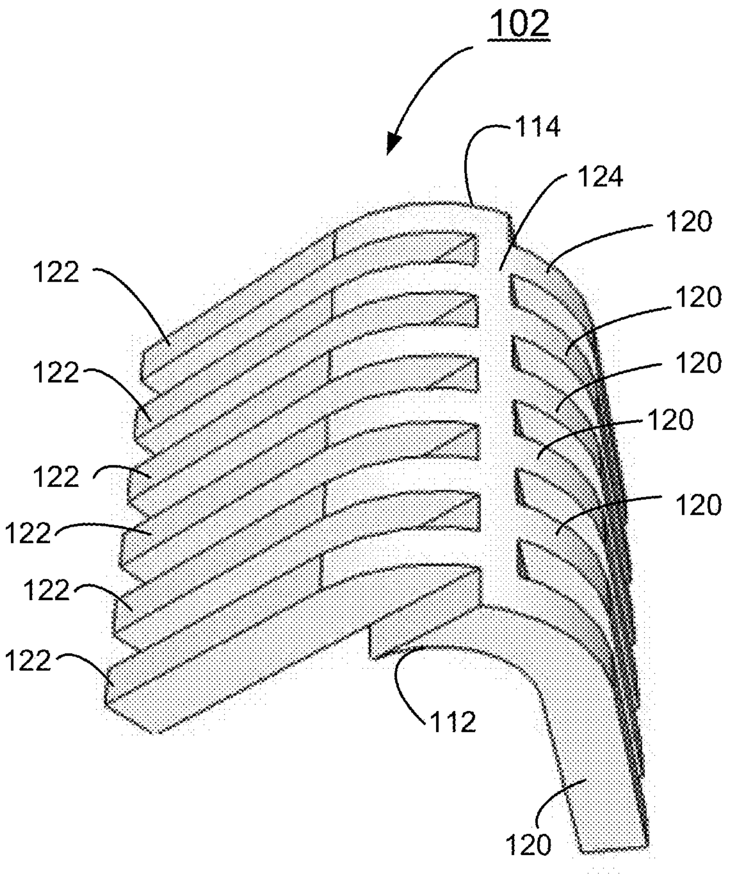

Referring also to FIGS. 5, 6, and 7, the ferrite core segments 102 forming the example adjustable size ferrite core structure 100 are shown in various views. Each of the ferrite core segments 102 includes an inner wall portion 110 extending between opposed ends 112, 114 with mating fingers extending along adjoining edges 116, 118.

Each ferrite core segment 102 of the adjustable size ferrite core structure 100 includes the elongated inner wall portion 110 and a plurality of offset and spaced apart mating fingers 120, 122 on the respective opposed edges 116, 118 extending outwardly from an elongated outer wall portion 124 shown in FIG. 7, opposite the elongated inner wall portion 110. Each of the plurality of ferrite core segments 102 includes an overall L shape, as shown.

The mating fingers 120, 122 of adjacent ferrite core segments 102 are arranged for sliding contact engagement. The ferrite core segments 102 are mated together defining the adjustable size cable receiving cavity, such as the illustrated cable receiving cavity 104 of FIG. 1A, cavity 106 of FIG. 1B, and cavity 108 of FIG. 1C. For example, the ferrite core segments 102 are mated around an associated cable and the adjustable retaining cover 105 retains the ferrite core segments tightly around the cable, maintaining effective electromagnetic interference (EMI) cable noise suppression.

In accordance with features of the invention, a plurality of ferrite core segments includes a plurality of U shaped segments. The adjustable cable receiving cavity includes a circular shape. The adjustable cable receiving cavity includes an oblong shape for use with flat cable, such as flat ribbon cable.

Figure 8A:
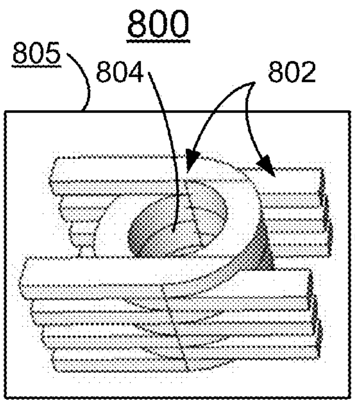
FIGS. 8A, 8B, and 8C are perspective views not to scale of another example structure for implementing an adjustable size ferrite core for electromagnetic interference (EMI) noise suppression in accordance with a preferred embodiment.
Figure 8B:
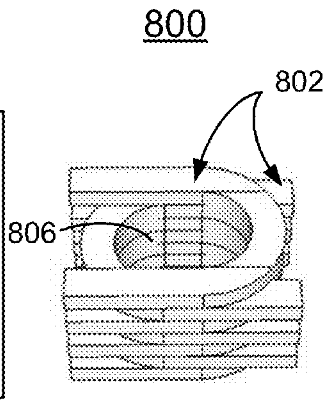
Figure 8C:
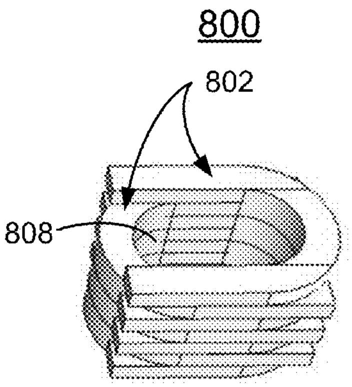

Referring also to FIGS. 8A, 8B, and 8C, there is shown another example structure for implementing an adjustable size ferrite core for electromagnetic interference (EMI) noise suppression generally designated by the reference character 800 in accordance with a preferred embodiment.

Referring to FIG. 8A, the adjustable size ferrite core structure 800 includes a plurality of ferrite core segments 802 that are mated together defining an adjustable size cable receiving cavity 804. In FIG. 8A, the ferrite core segments 802 are positioned in a fully closed position. In FIG. 8A, the ferrite core segments 802 fit together concentrically around a center of the cable receiving cavity 804.

In FIG. 8A, a retaining cover 805 is schematically shown. The ferrite core segments 802 are mated together around an associated cable (not shown) and are held together with the retaining cover 805, such as multiple plastic retaining members or other housing. The retaining cover 805 is an adjustable retaining cover configured to provide a force on each of the ferrite core segments 802 with the plurality of ferrite core segments 802 mated together defining a particular adjustable size cable receiving cavity, such as cavity 804.

Referring to FIG. 8B, the adjustable size ferrite core structure 800 includes the plurality of ferrite core segments 802 that are mated together defining another adjustable size cable receiving cavity 806, for a larger diameter cable.

Referring to FIG. 8C, the adjustable size ferrite core structure 800 includes the plurality of ferrite core segments 802 that are mated together defining another adjustable size cable receiving cavity 808, for another larger diameter cable.

Figure 9:
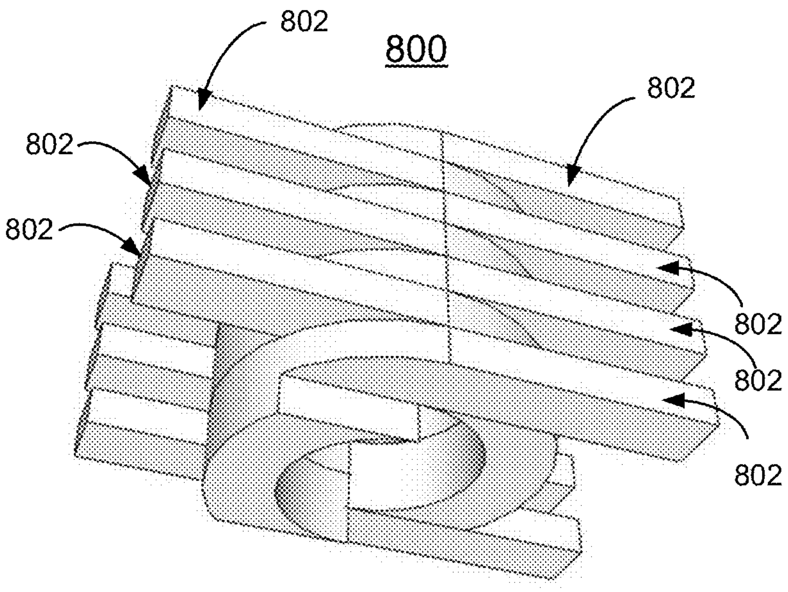
FIGS. 9 and 10 are perspective views not to scale further illustrating the example structure of FIG. 8A for implementing an adjustable size ferrite core for electromagnetic interference (EMI) noise suppression in accordance with a preferred embodiment.
Figure 10:
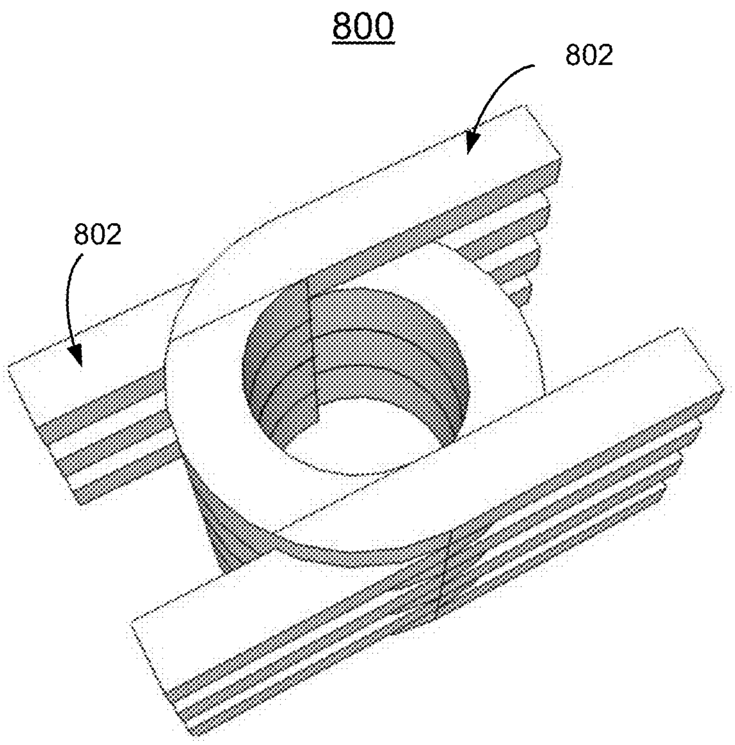

Referring to FIGS. 9 and 10, the example structure 800 of FIG. 8A for implementing the adjustable size cable receiving cavity 804 is further illustrated in other top and bottom views.

Figure 11:
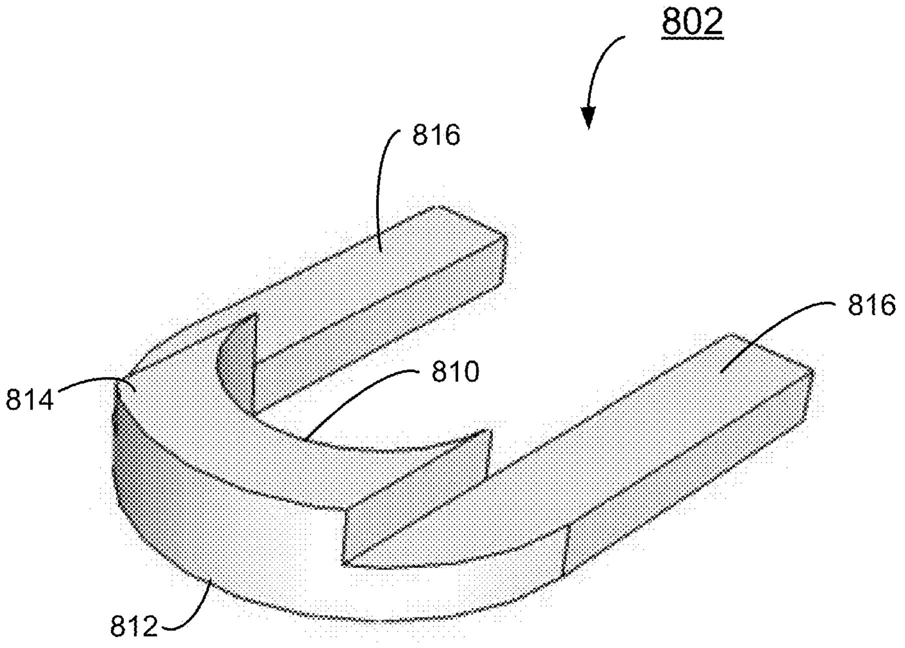
FIGS. 11 and 12 are perspective views not to scale further illustrating the ferrite core segment of the example structure of FIGS. 8A, 8B, and 8C for implementing an adjustable size ferrite core for electromagnetic interference (EMI) noise suppression in accordance with a preferred embodiment.
Figure 12:
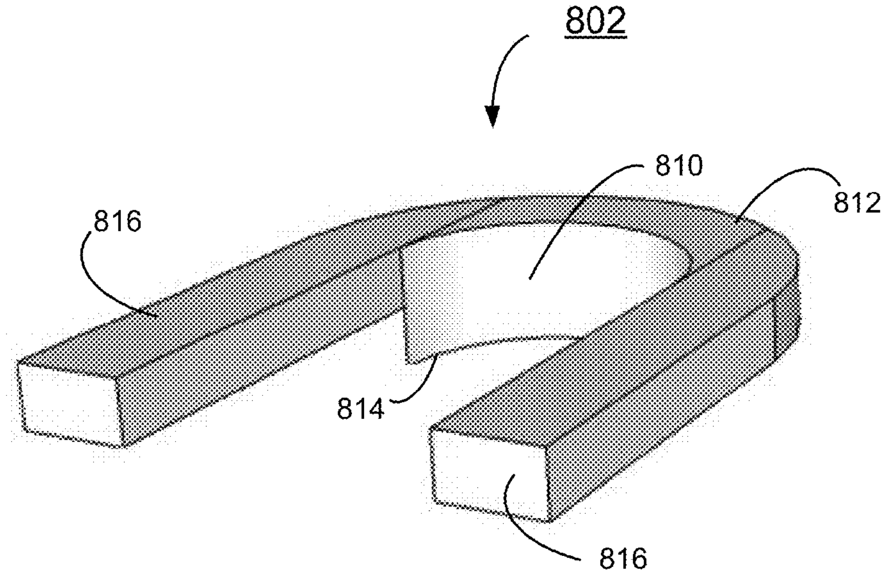

Referring to FIGS. 11 and 12, there are shown the ferrite core segments 802 of the example adjustable size ferrite core structure 800 of FIGS. 8A, 8B, 8C, 9, and 10 for implementing an adjustable size ferrite core for electromagnetic interference (EMI) noise suppression in accordance with a preferred embodiment. The ferrite core segments 802 are generally U shaped segments.

Each of the ferrite core segments 802 includes an inner wall portion 810 extending between opposed ends 812, 814 with a respective mating finger 816 extending outwardly along adjoining edges.

While the present invention has been described with reference to the details of the embodiments of the invention shown in the drawing, these details are not intended to limit the scope of the invention as claimed in the appended claims.

What is claimed is:

1. A structure for implementing an adjustable size ferrite core for electromagnetic interference (EMI) cable noise suppression comprising:

a plurality of ferrite core segments;

said plurality of said ferrite core segments being mated together for defining an adjustable size cable receiving cavity;

each of said ferrite core segments including an inner wall portion with mating fingers extending along adjoining edges; and said mating fingers of said ferrite core segments being selectively positioned together to provide a size of said adjustable cable receiving cavity.

2. The structure as recited in claim 1 wherein said mating fingers of adjacent ferrite core segments fit together to locate said inner wall portions at a selected distance from a center of said adjustable cable receiving cavity.

3. The structure as recited in claim 1 wherein each said ferrite core segments is formed of a material having a magnetic permeability greater than one.

4. The structure as recited in claim 1 wherein said adjustable cable receiving cavity includes a circular shape.

5. The structure as recited in claim 1 wherein said mating fingers of adjacent ferrite core segments are selectively positioned together by sliding contact engagement of said mating fingers.

6. The structure as recited in claim 1 includes a retaining cover holding said mating fingers of said ferrite core segments selectively positioned together for said selected size of said adjustable cable receiving cavity.

7. The structure as recited in claim 6 wherein said inner wall portion of said ferrite core segments includes an elongated inner wall portion and said mating fingers are offset and spaced apart on opposed edges of said elongated inner wall portion between opposed ends of said elongated inner wall portion.

8. The structure as recited in claim 7 wherein said ferrite core segments includes an L shape.

9. The structure as recited in claim 1 wherein said ferrite core segments includes a plurality of U shaped segments.

10. The structure as recited in claim 1 wherein said adjustable cable receiving cavity includes an oblong shape.

11. The structure as recited in claim 1 wherein said mating fingers of said ferrite core segments are selectively positioned together to adjust said adjustable cable receiving cavity to a diameter of an associated cable.

12. The structure as recited in claim 11 further includes a retaining cover maintaining said ferrite core segments selectively positioned together.

* * * * *